United States Patent
Liu et al.

(10) Patent No.: US 7,214,589 B2
(45) Date of Patent: May 8, 2007

(54) FLASH MEMORY CELL AND METHODS FOR FABRICATING SAME

(75) Inventors: Yuan-Hung Liu, Hsin-Chu (TW); Yeur-Luen Tu, Taichung (TW)

(73) Assignee: Taiwan Semiconductor Manufacturing Co., Ltd., Taiwan (CN)

( * ) Notice: Subject to any disclaimer, the term of this patent is extended or adjusted under 35 U.S.C. 154(b) by 0 days.

(21) Appl. No.: 10/803,448

(22) Filed: Mar. 18, 2004

(65) Prior Publication Data
US 2005/0205922 A1 Sep. 22, 2005

(51) Int. Cl.
*H01L 21/336* (2006.01)

(52) U.S. Cl. .................. 438/259; 438/257; 438/268

(58) Field of Classification Search ............. 438/257, 438/259, 268
See application file for complete search history.

(56) References Cited

U.S. PATENT DOCUMENTS

| | | | |
|---|---|---|---|
| 6,001,687 A | 12/1999 | Chu et al. | |
| 6,130,453 A * | 10/2000 | Mei et al. | 257/315 |
| 6,259,131 B1 | 7/2001 | Sung et al. | |
| 6,385,089 B2 | 5/2002 | Sung et al. | |
| 6,538,277 B2 | 3/2003 | Sung et al. | |
| 6,559,501 B2 | 5/2003 | Sung et al. | |
| 6,569,736 B1 * | 5/2003 | Hsu et al. | 438/267 |
| 6,812,120 B1 * | 11/2004 | Young et al. | 438/589 |
| 2003/0209753 A1 * | 11/2003 | Kamiya et al. | 257/314 |
| 2005/0145920 A1 * | 7/2005 | Chang et al. | 257/315 |

* cited by examiner

*Primary Examiner*—Long Pham
(74) *Attorney, Agent, or Firm*—Duane Morris LLP

(57) ABSTRACT

A split gate flash memory cell having floating gates with sharp, upwardly flared corners, protective caps of dielectric material which are substantially square or rectangular in cross-section, and elongated and thin Vss dielectric spacers disposed along substantially planar side walls defined by the floating gates and the protective caps.

16 Claims, 17 Drawing Sheets

FLASH MEMORY CELL AND METHODS FOR FABRICATING SAME

FIELD OF INVENTION

The present invention relates to semiconductors. More specifically, the present invention relates to a split gate flash memory cell for split gate flash memories and embedded split gate flash memories, and methods for fabricating such a memory cell.

BACKGROUND OF THE INVENTION

Split gate flash memory cells for split gate flash memories and embedded split gate flash memories are typically fabricated using numerous etching processes. A substantial number of these etching processes are critical for fabricating the structures of the memory cells. The numerous etching processes create serious oxide loss in the shallow trench isolation (STI) regions. To avoid serious oxide loss, the floating gate etching window must be very narrow and is therefore, not suitable for mass production.

In addition, a number of these etching processes are used for forming the floating gates of the cells. Due to all of these etching processes, an oxide micro-mask may be formed in the floating gate poly etching process, which presents a serious bridging issue.

SUMMARY OF INVENTION

A flash memory cell is disclosed herein where the cell comprises a floating gate having sharp, upwardly flared corners.

The flash memory cell may also comprise a cap of dielectric material covering the floating gate, wherein the cap has a substantially square or substantially rectangular cross sectional shape.

The flash memory cell may further comprise a dielectric Vss spacer covering a generally planar side wall defined by the floating gate and the cap.

A method of making the flash memory cell is also disclosed herein. The method comprises providing a substrate of semiconductor material; forming a mask film over the substrate; defining a trench in the mask film; at least partially filling the trench with a first film of electroconductive material; and etching back a portion of the first film of electroconductive material to partially form the floating gate with the sharp, upwardly flared corners.

DETAILED DESCRIPTION OF THE INVENTION

The present invention is an improved split gate flash memory cell for split gate flash memories and embedded split gate flash memories, which is fabricated in method that utilizes a significantly reduced number of etching processes, and includes only a single critical etching process. As will become apparent further on, the method of the invention does not consume shallow trench isolation (STI) oxide and bridging issues are eliminated, as no floating gate etching process is utilized.

The method of the invention commences with STI processing of semiconductor substrate 10, as shown in FIGS. 1A–1D. The semiconductor substrate 10 is not limited to a particular type and may be those generally used in a semiconductor memory device, examples thereof including an element semiconductor, such as Si and Ge, and a compound semiconductor, such as GaAs, InGaAs and ZnSe.

Figure 1A:
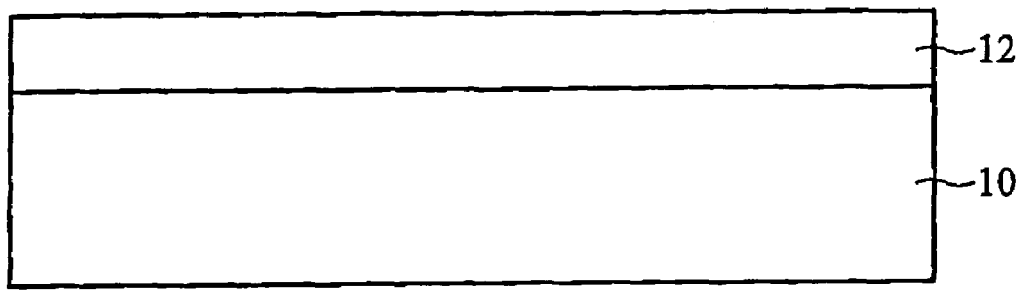
FIGS. 1A–1D, 2A–2H, 3A–3E, 4A–4G, 5A–5C, 6A–6C, and 7A–7C are plan and cross-sectional views illustrating the method of the present invention, wherein the cross-sectional views of FIGS. 1A–1D and 2A depict a first vertical plane through a substrate on which the memory cell of the invention is fabricated and the cross-sectional views of FIGS. 2B–2H, 3A, 3B, 3D, 3E, 4A–4D, 4F, 5A–5C, 6A–6C, and 7A–7C depict a second vertical plane through the substrate that is perpendicular to the first vertical plane.

As shown in FIG. 1A, film 12 of dielectric material is formed over an active region of substrate 10. Film 12 may comprise, without limitation, a nitride such as SiN, deposited by low pressure chemical vapor deposition (LPCVD). Film 12 may be formed to a thickness which ranges between about 1200 Angstroms (A) and about 1800 A. In one illustrative embodiment, film 12 may be formed to a thickness of about 1620 A. A thermal oxide film (not shown) may be disposed between substrate 10 and film 12. The thermal oxide film may have a thickness of about 120 A to about 170 A.

Figure 1B:
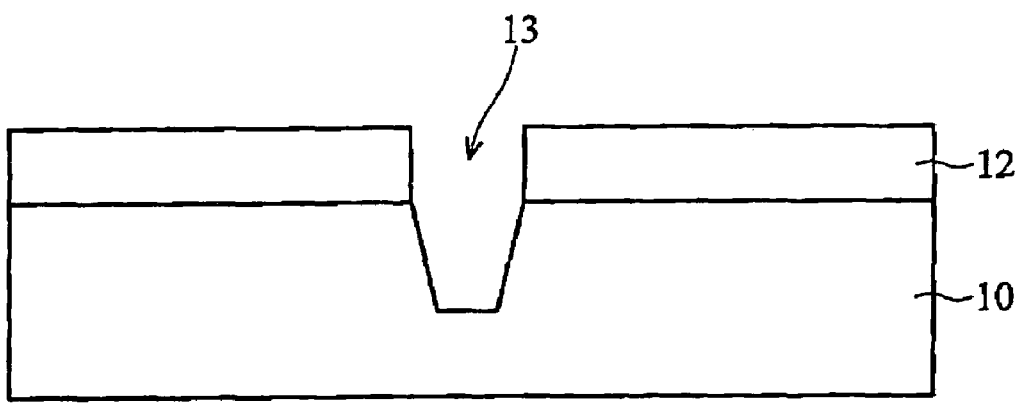

Substrate 10 is then STI masked and unmasked portions of film 12 and the underlying areas of substrate 10 are etched to form shallow trenches 13 (only one is shown for purposes of clarity), as shown in FIG. 1B. Etching may be accomplished using, for example, reactive ion etching (RIE). Shallow trenches 13 may have a depth between about 2000 A and about 6000 A.

Figure 1C:
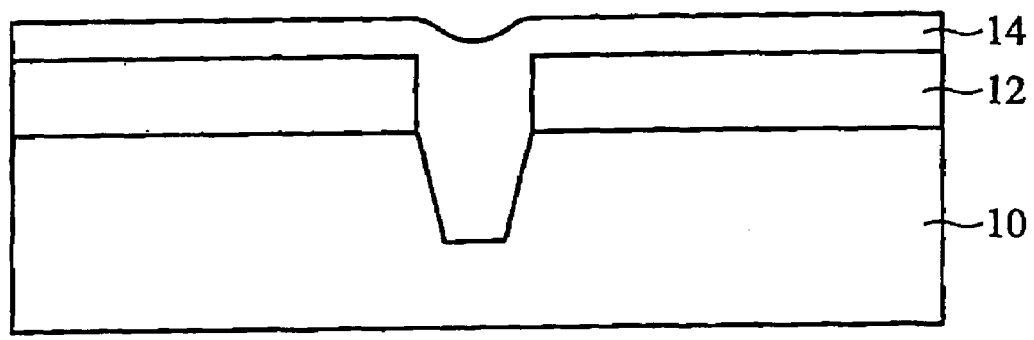

Shallow trenches 13 are then filled with a suitable dielectric isolation material, such as silicon oxide by forming film 14 of the dielectric material conformally over substrate 10, as shown in FIG. 1C. Film 14 may be formed using, for example, high density plasma chemical vapor deposition (HDP CVD) or low pressure chemical vapor deposition (LPCVD).

Figure 1D:
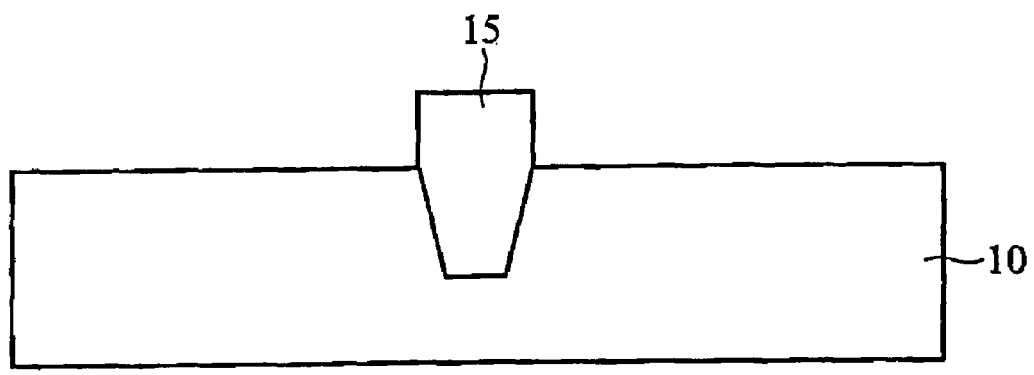

Substrate 10 is subsequently planarized using film 12 as a stop layer. Planarizing may be accomplished with a chemical mechanical polishing (CMP) process. After planarizing, film 12 is removed (a nitride strip may be used, for example, when film 12 is made of SiN) to form STI regions 15 which extend partially above the surface of substrate 10, as shown in FIG. 1D.

Figure 2A:
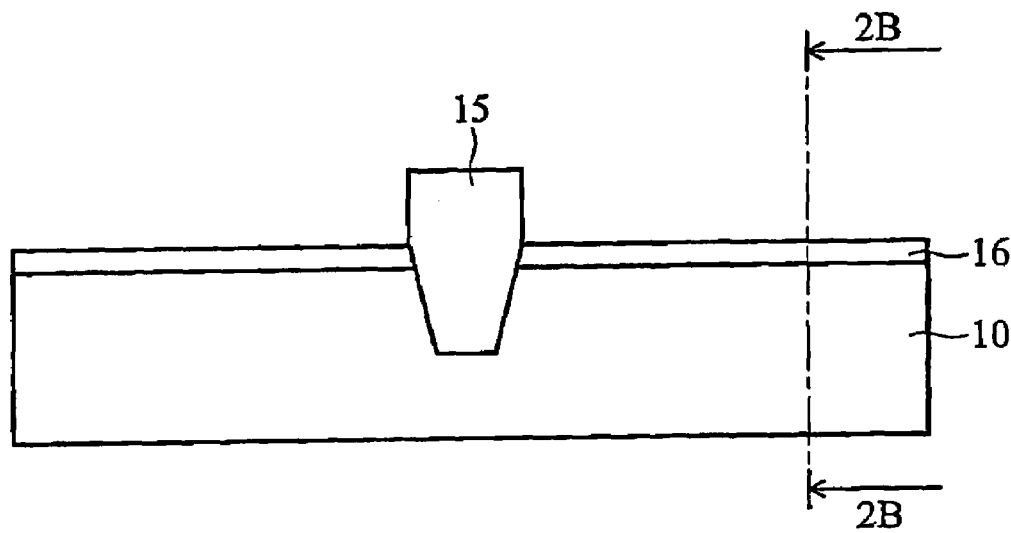

Once STI processing has been completed, a pad oxide on which the split floating gate structure of the memory cell will reside, is formed over an active region of substrate 10. More specifically, in FIG. 2A which is a cross-sectional view through STI region 15 and FIG. 2B which is a sectional view through line 2B–2B of FIG. 2A, film 16 of dielectric material (the pad oxide) is formed over an active region of substrate 10. In embodiments where substrate 10 is composed of Si, dielectric film 16 may comprise a thermally grown oxide such as silicon dioxide. Dielectric film 16 is typically formed to a thickness which ranges between about 80 A and about 180 A. In one illustrative embodiment, dielectric film 16 may be formed to a thickness of about 120 A.

Figure 2B:
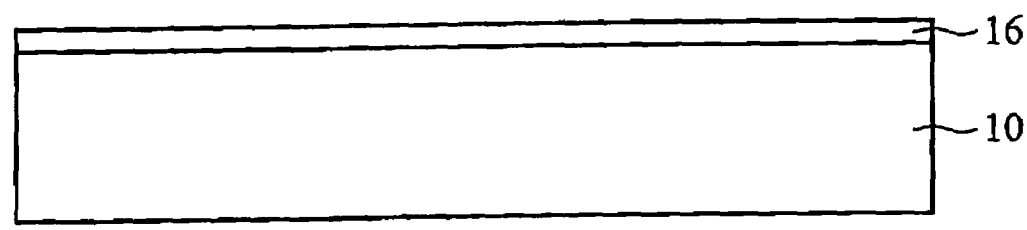
Figure 2C:
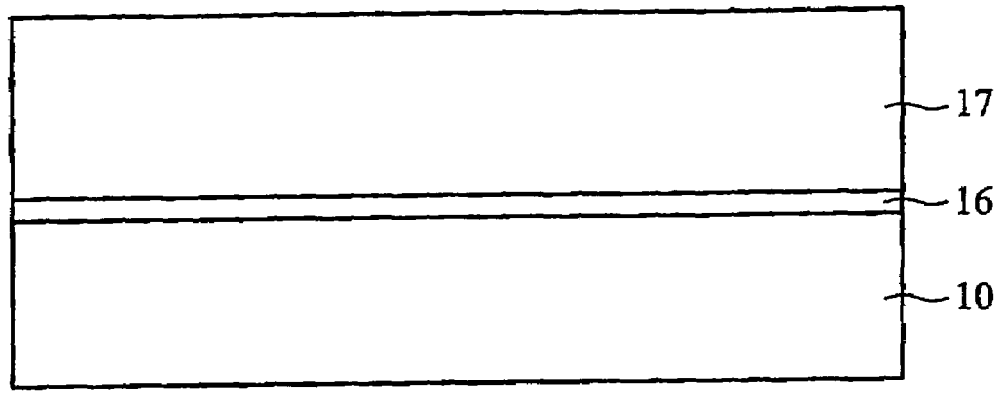

FIG. 2C illustrates substrate 10, as shown in FIG. 2B, after floating gate mask film 17 (FLG mask 17) has been formed thereover. In one embodiment, FLG mask 17 may be composed of SiN. Such a FG mask 17 may be formed using CVD, for example. FLG mask 17 is typically formed to a thickness which ranges between about 3500 A and about 4500 A. In one illustrative embodiment, FLG mask 17 may be formed to a thickness of about 4000 A.

Figure 2D:
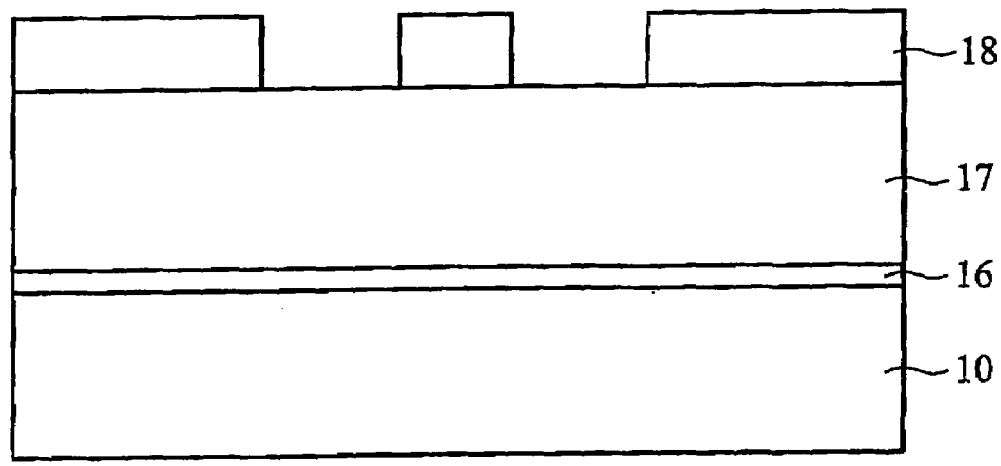
Figure 2E:
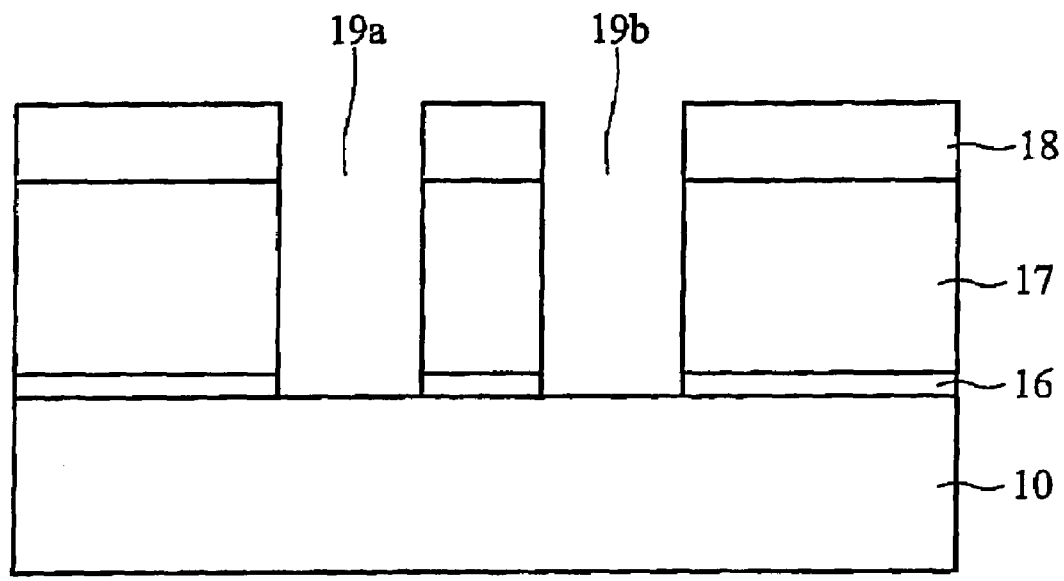

In FIG. 2D, photoresist mask 18 is formed over substrate 10 and in FIG. 2E, unmasked portions of FLG mask 17 are removed thereby forming a pair of spaced apart trenches 19. The unmasked portions of the FLG mask 17 may be removed using an etch process, such as RIE.

Figure 2F:
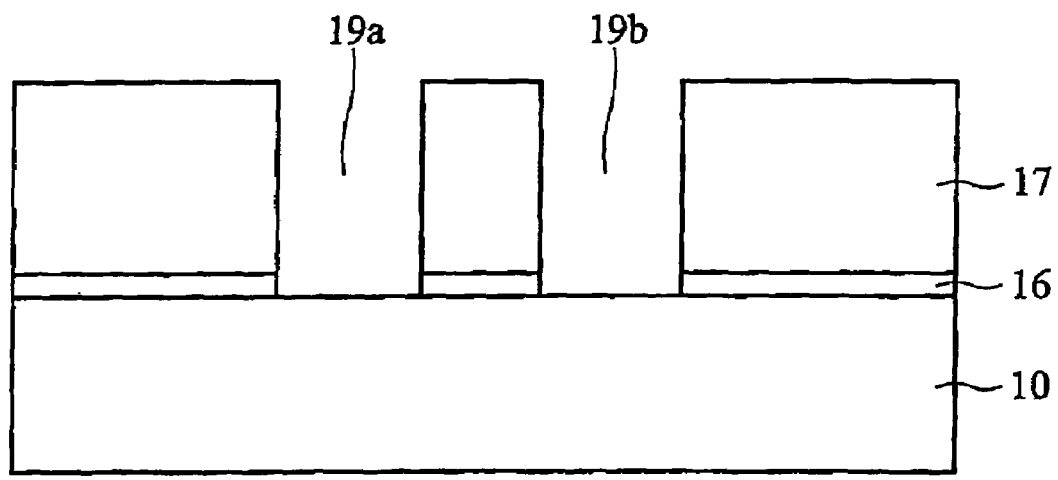

As shown in FIG. 2F, exposed portions of the dielectric film 16 at the bottom of trenches 19 are removed using, for example, a wet etch process that utilizes dilute HF acid. The dielectric film removal process exposes the underlying portions of substrate 10 at the bottom of trenches 19.

Figure 2G:
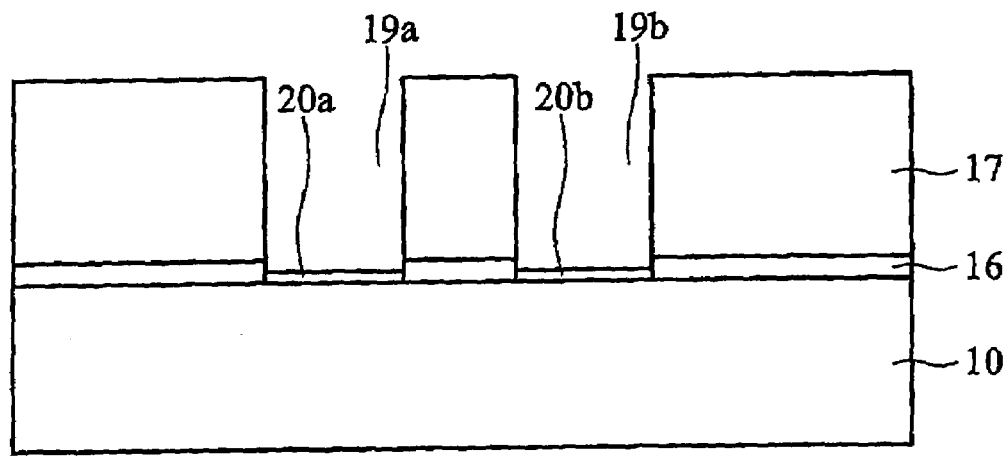

In FIG. 2G, coupling films 20a and 20b composed of a dielectric material are formed over the exposed portions of the substrate 10 at the bottom of the trenches 19. In embodiments where the substrate 10 is composed of Si, the coupling films 20a and 20b may comprise silicon dioxide, which may be thermally grown on the substrate 10. The coupling films 20a and 20b are typically formed to a thickness which ranges between about 60 A and about 100 A. In one illustrative embodiment, the coupling films 20a and 20b may each be formed to a thickness of about 80 A.

Figure 2H:
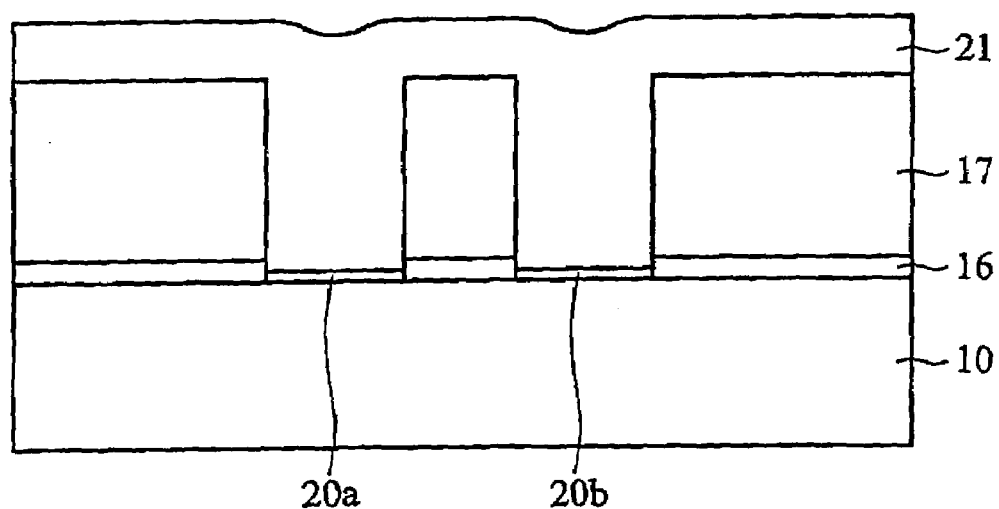

In FIG. 2H, the trenches 19 are filled with conformal film 21 of electroconductive material, such as doped polysilicon. Electroconductive film 21 may be formed using conventional methods including, without limitation, CVD and physical vapor deposition (PVD) utilizing sputtering methods employing suitable source materials. In one embodiment, electroconductive film 21 may have a thickness of about 2200 A.

Figure 3A:
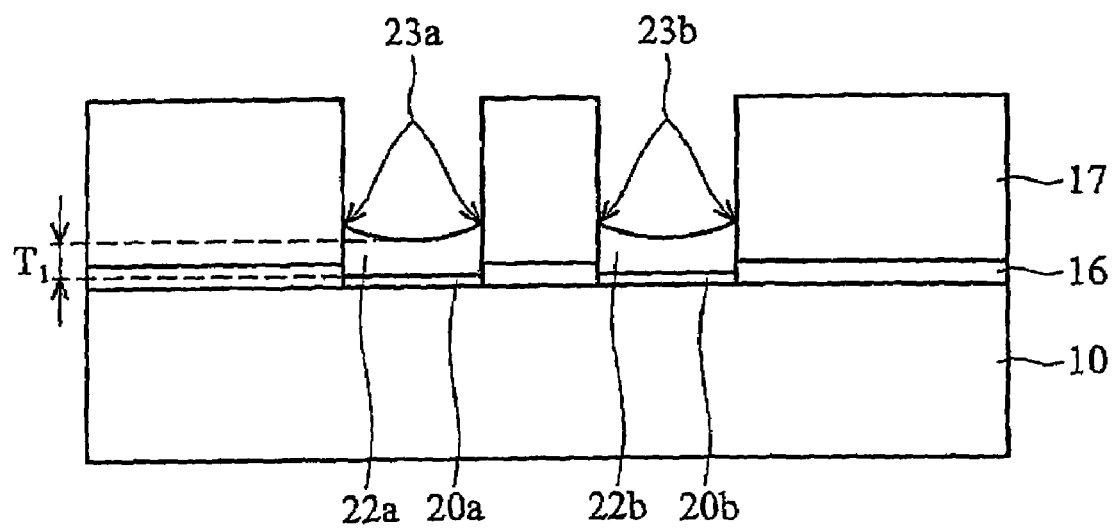
Figure 3B:
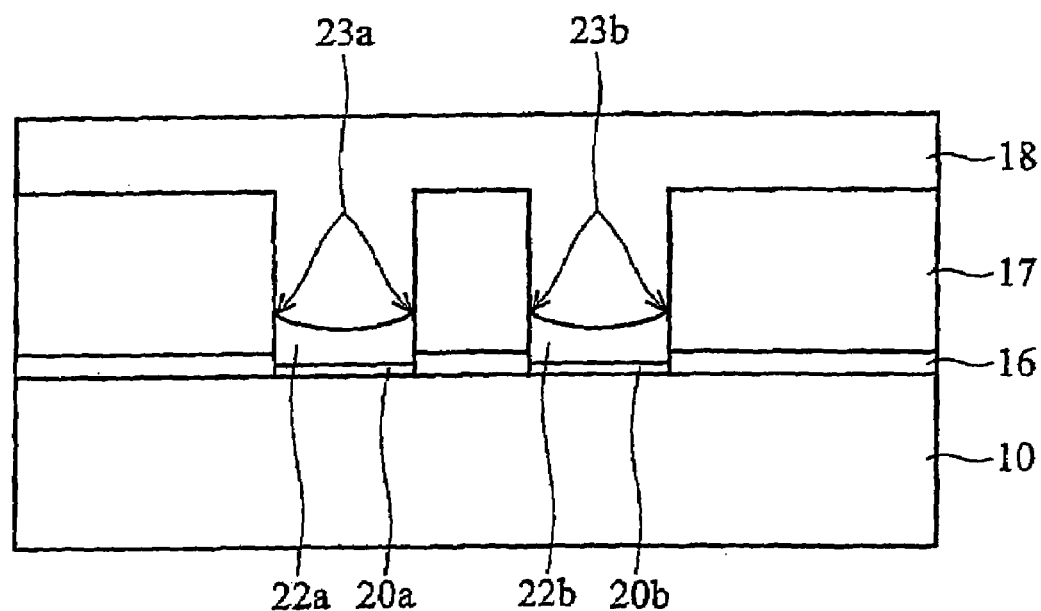
Figure 3C:
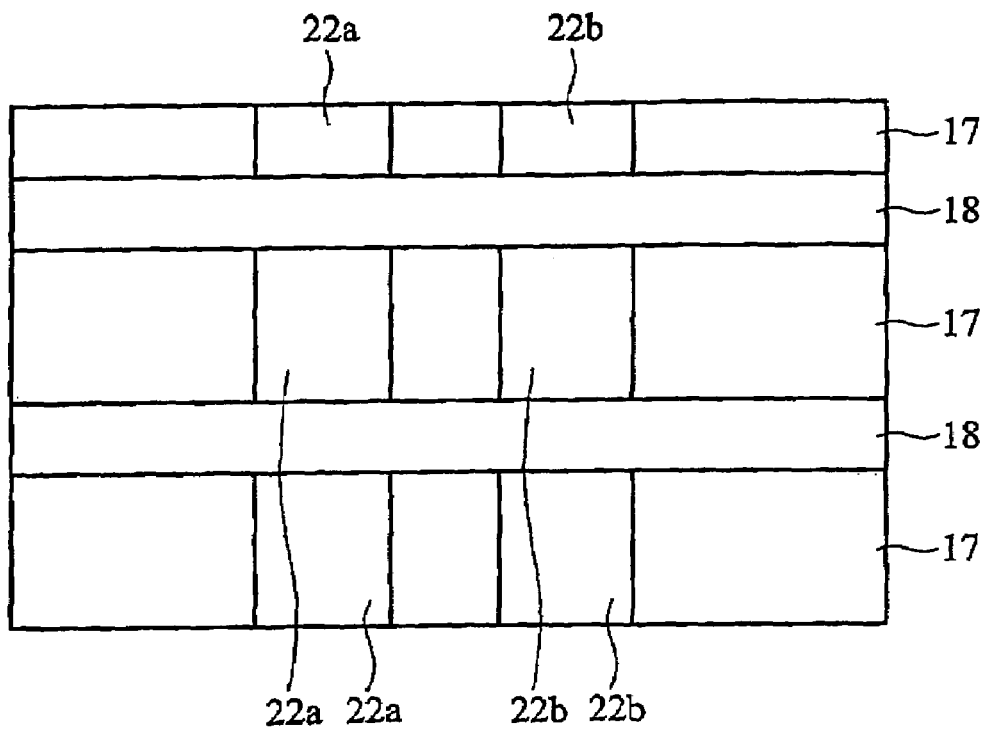
Figure 3D:
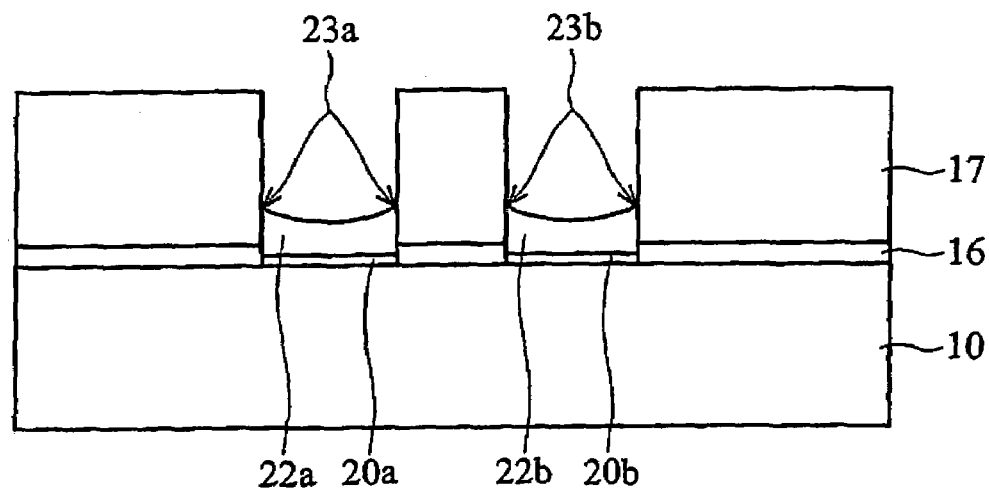
Figure 3E:
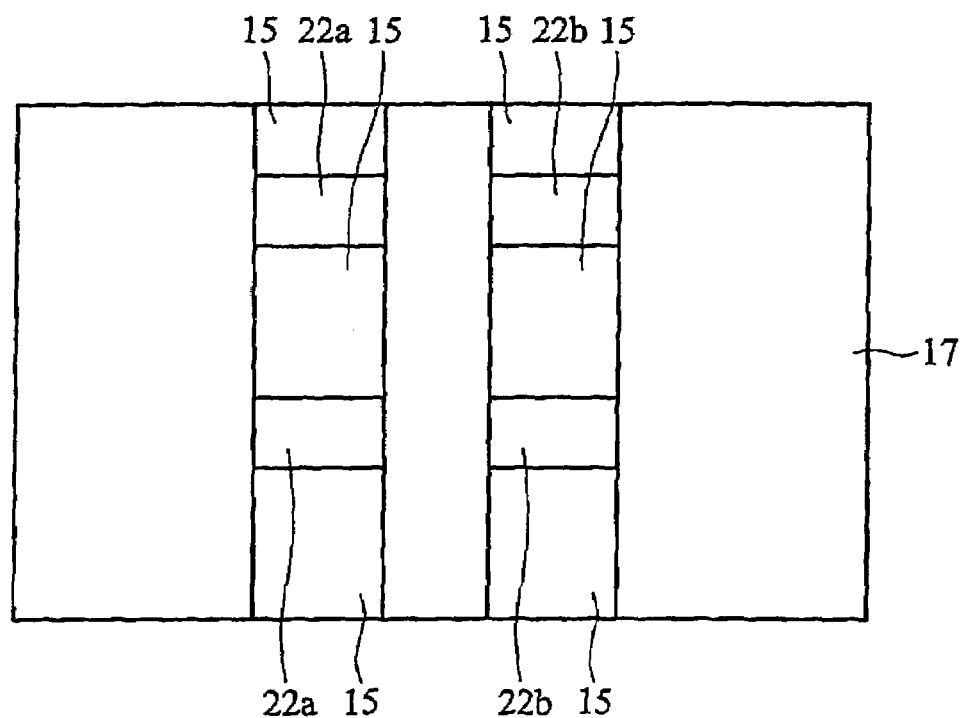

FIGS. 3A–3E illustrate a first method for forming the split floating gate structure starting with substrate 10 shown in FIG. 2H. In FIG. 3A, electroconductive film 21 is partially removed using a conventional etch-back process to form floating gates 22a and 22b with sharp, upwardly flared corners 23a and 23b respectively. In one exemplary embodiment, the floating gates 22a and 22b may have a thickness $T_1$ of about 600 A. Next, patterned mask film 18 is formed over substrate 10 as collectively shown in FIGS. 3B and 3C. Patterned mask film 18 may be a layer of photoresist. In FIGS. 3D and 3E, the unmasked areas of floating gates 22a and 22b are removed down to STI regions 15 to electrically isolate each unit cell. This may be accomplished using a plasma etching process. Patterned mask film 18 is then striped from substrate 10.

Figure 4A:
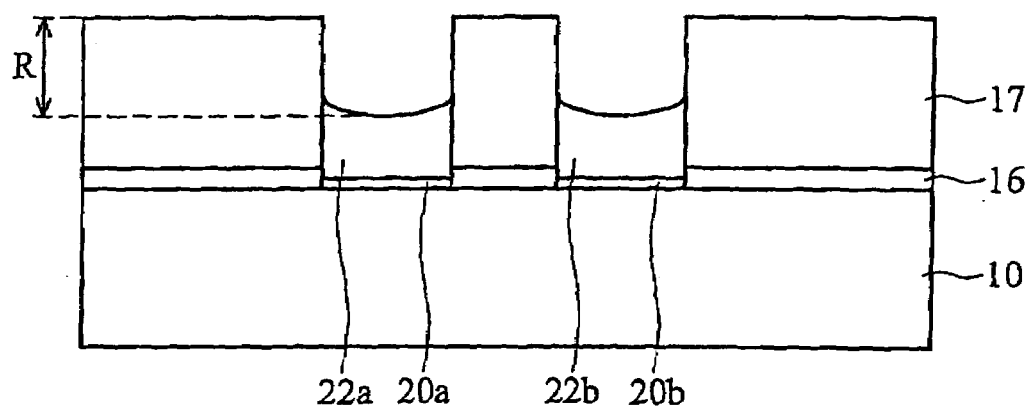
Figure 4B:
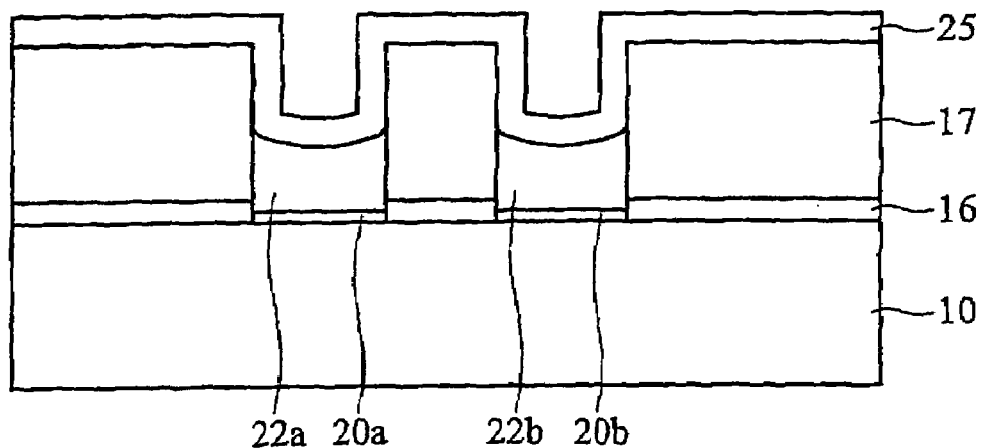
Figure 4C:
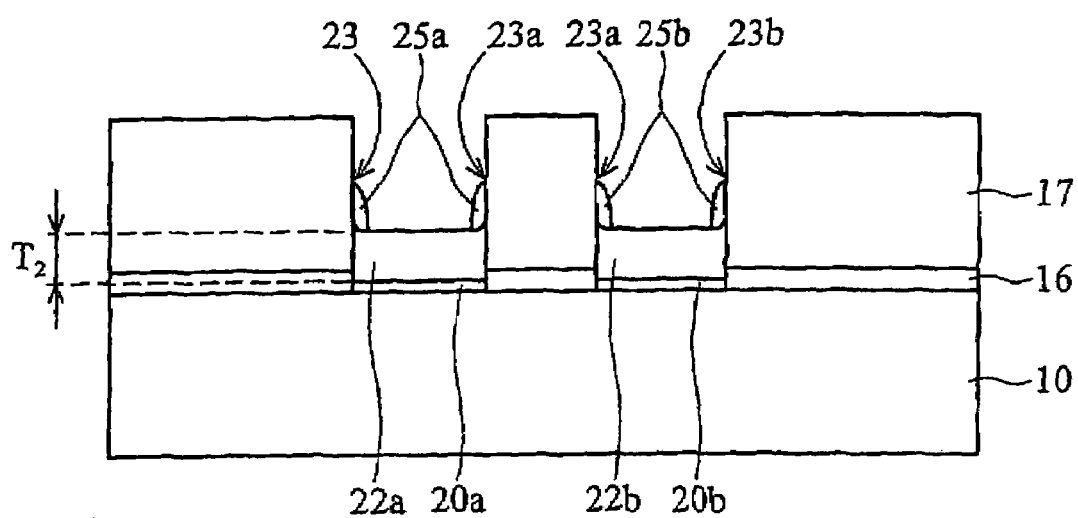
Figure 4D:
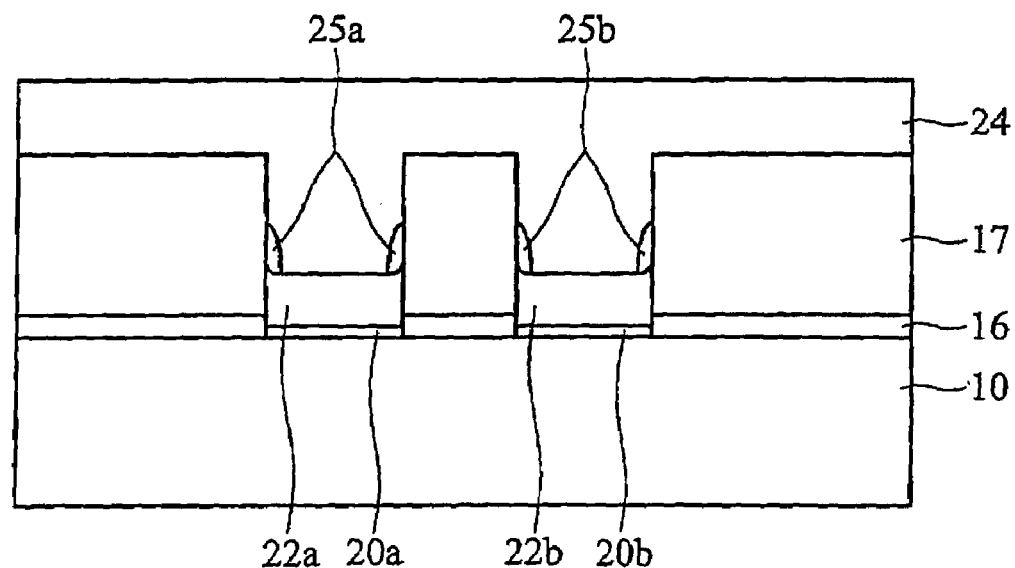
Figure 4E:
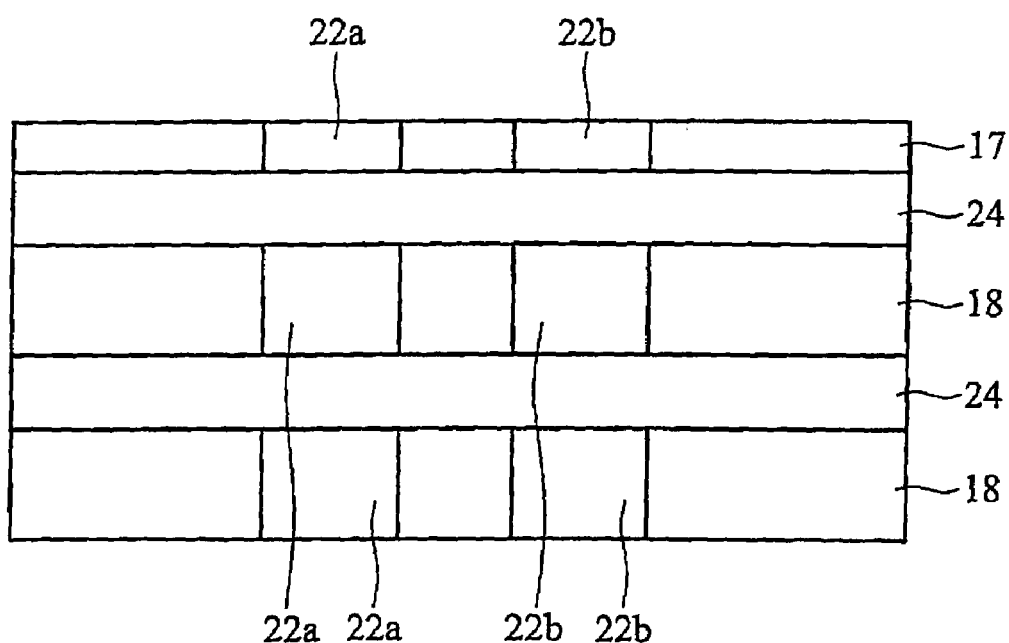
Figure 4F:
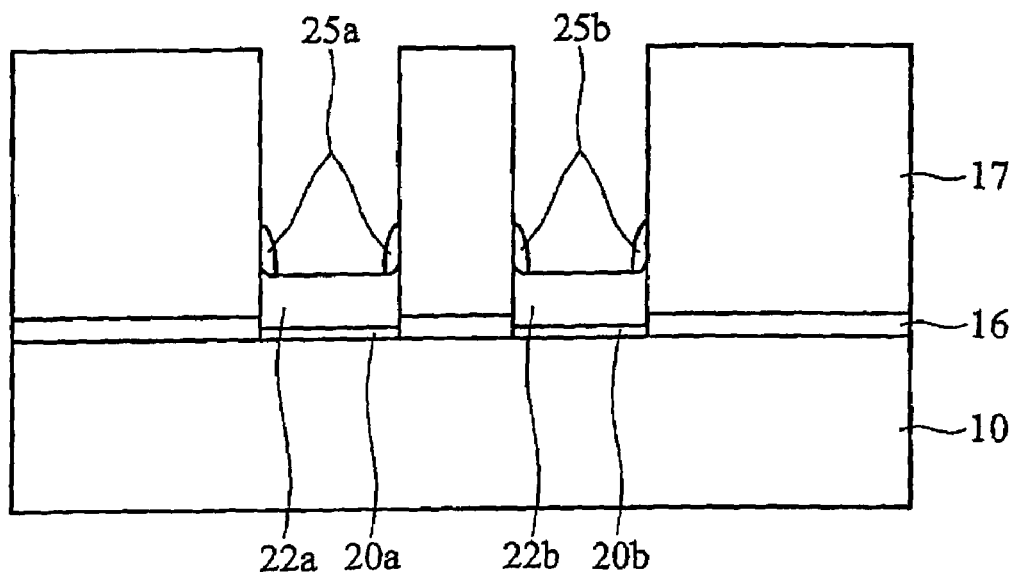
Figure 4G:
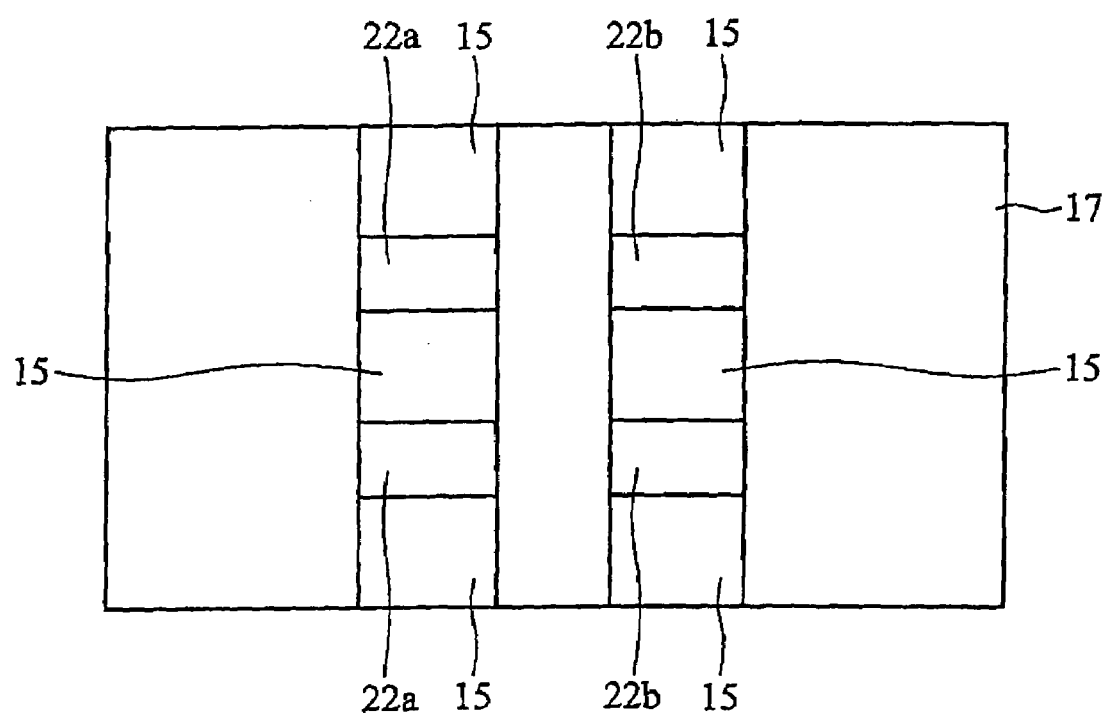

FIGS. 4A–4G illustrate a second method for forming the split floating gate structure starting with substrate 10 shown in FIG. 2H. In FIG. 4A, electroconductive film 21 is partially removed using a conventional etch-back process to recess the electroconductive film 21 below the surface of FLG mask film 17. In one exemplary embodiment, each recess R may be about 800 A. After etch-back, electroconductive film 25 is conformally formed over substrate 10, shown in FIG. 4B. In FIG. 4C, electroconductive films 21 and 25 are partially removed using a conventional etch-back process to form floating gates 22a and 22b with sharp, upwardly flared corners 23a and 23b provided by electroconductive film spacers 25a and 25b formed from the partially removed electroconductive film 25. In one exemplary embodiment, floating gates 22a and 22b made according to the second method may have a thickness $T_2$ of about 600 A. Next, patterned mask film 24 is formed over substrate 10 as collectively shown in FIGS. 4D and 4E. As in the first method, mask film 24 may be a layer of photoresist. As collectively shown in FIGS. 4F and 4G, the unmasked areas of floating gates 22a and 22b are subsequently removed down to STI regions 15 to electrically isolate each unit cell using a plasma etching process and patterned mask film 24 is then striped from substrate 10.

Figure 5A:
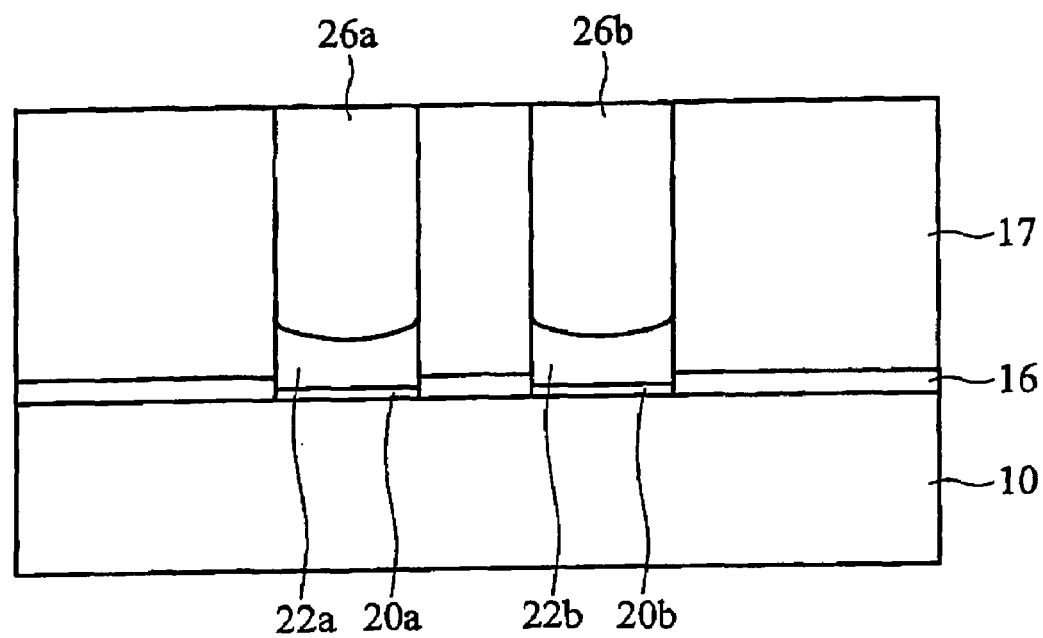
Figure 5B:
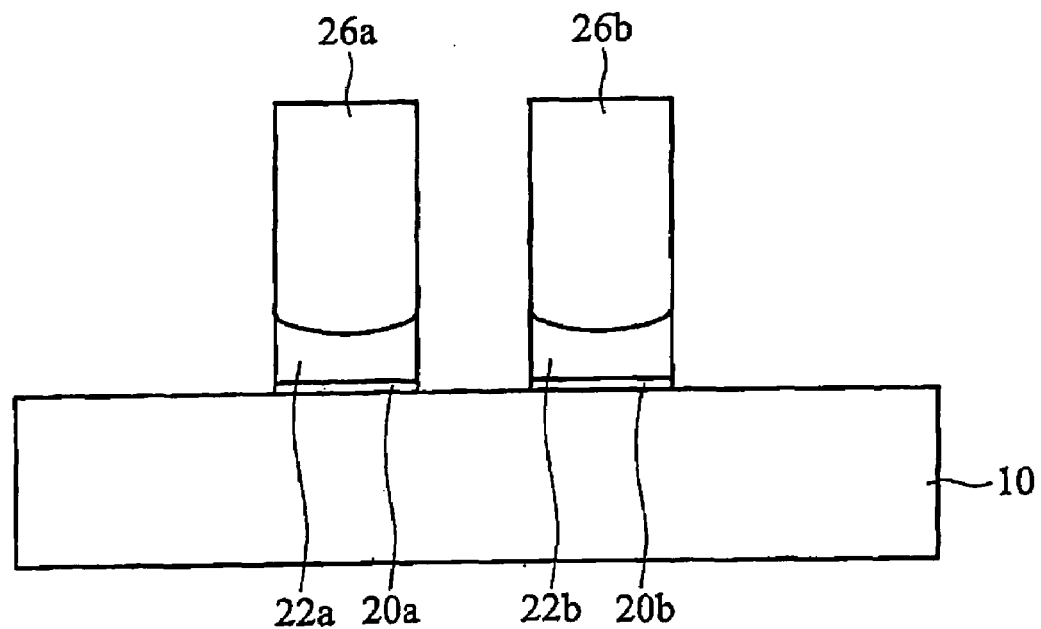
Figure 5C:
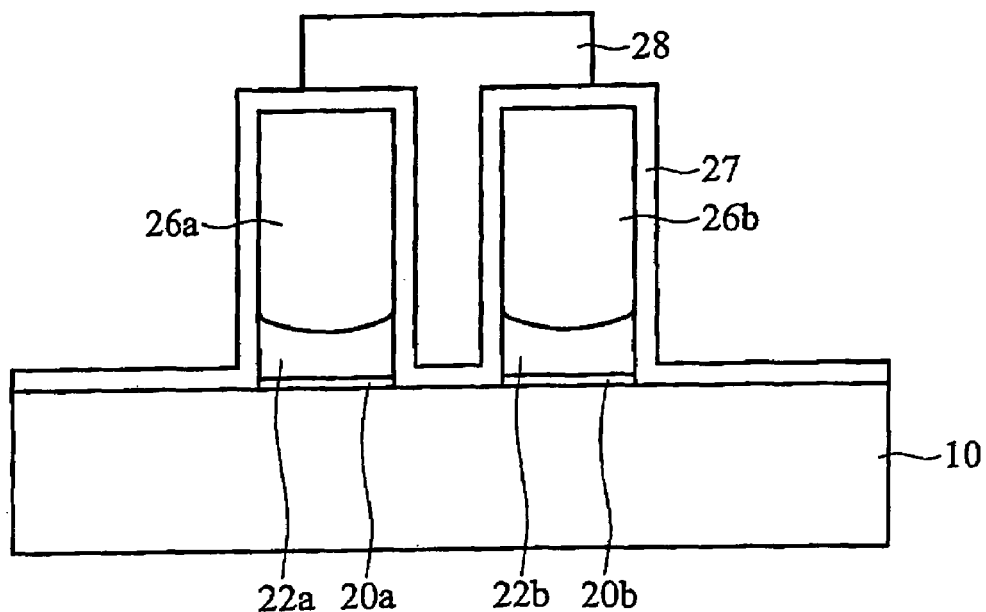

Once floating gates 22a and 22b have been formed (using either one of the two methods described above), a protective cap 26 of dielectric material is formed on each floating gate 22a and 22b using the exemplary method shown in FIGS. 5A–5C. Specifically, in FIG. 5A, a conformal film of dielectric material, such as silicon oxide, is formed over substrate 10 using, for example, HDP CVD, such that it fills the spaces above floating gates 22a and 22b. The film is then planarized such that the only remaining portions of the film are the caps 26 (filling trenches 19). As can be seen in the cross-sectional view of FIG. 5A, the caps 26 each have a substantially rectangular or square shape. The conformal film of dielectric material may be formed using HDP CVD. The conformal film of dielectric material may be planarized using a CMP process that utilizes FLG mask 17 as a stop layer.

The FLG mask 17 and dielectric film 16 are then removed from substrate 10, as shown in FIG. 5B. Removal of these films may be accomplished using a wet chemical etch process that employs hot $H_3PO_4$ acid and dilute HF acid, respectively.

Finally, as shown in FIG. 5C, conformal film 27 of dielectric material is formed over substrate 10 and areas thereof are masked with mask layer 28. In one embodiment, conformal film 27 may be silicon oxide formed to a thickness of about 800 A using a thermal growing process. Mask layer 28 may be a patterned layer of photoresist.

Figure 6A:
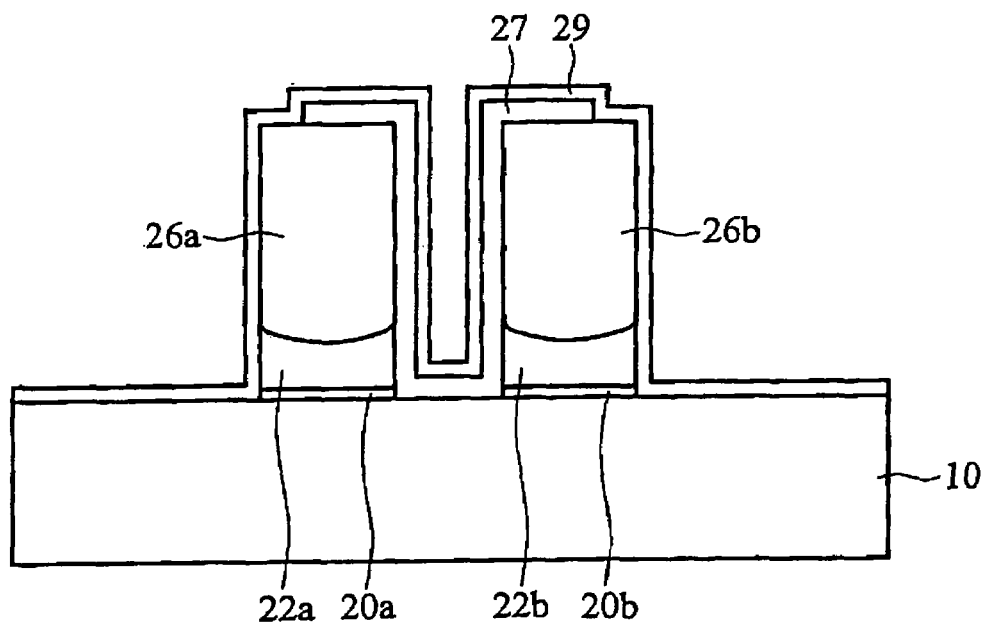
Figure 6B:
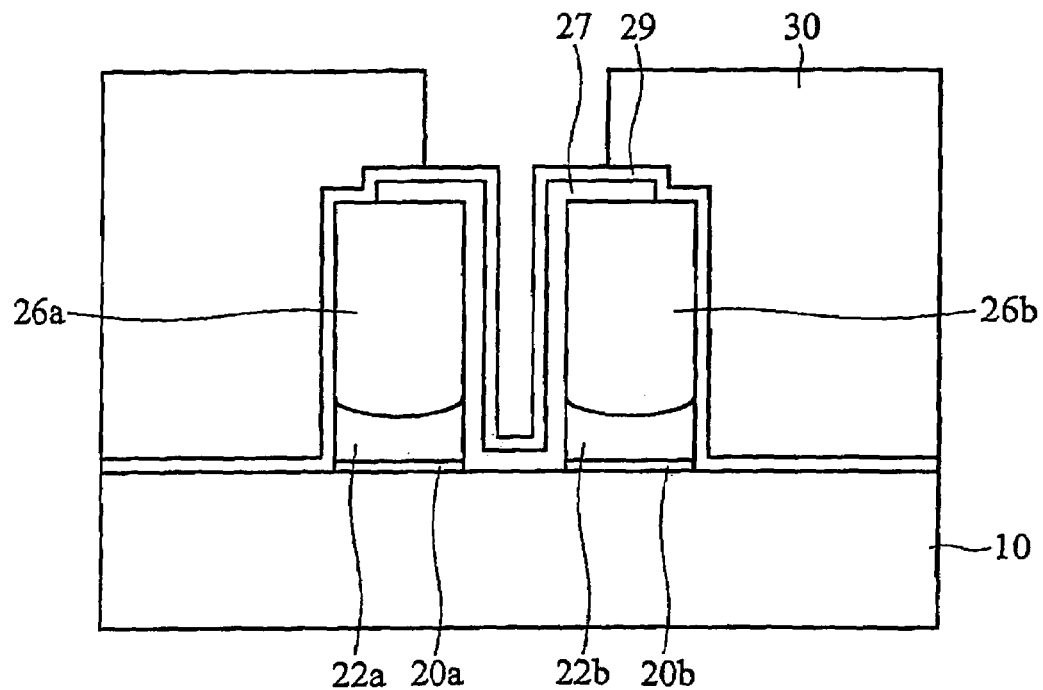
Figure 6C:
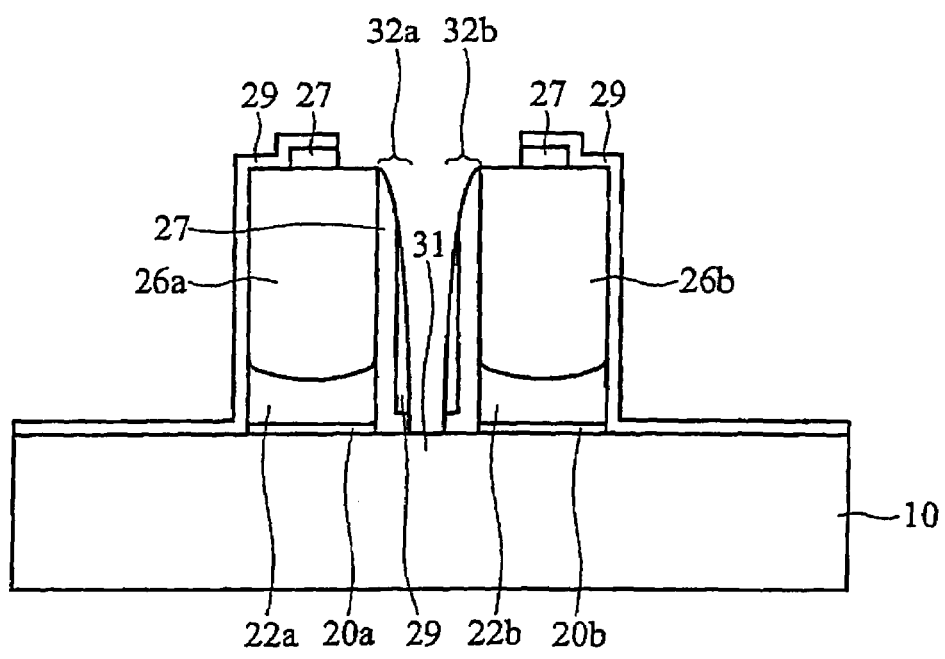

FIGS. 6A–6C illustrate an exemplary method for forming Vss spacers. In FIG. 6A, the unmasked areas of film 27 have been removed (followed by the removal of the mask layer 28) and a conformal tunneling film 29 has been subsequently formed over substrate 10. The unmasked areas of film 27 may be removed using an etching process, such as a wet chemical etch process employing dilute HF acid. In one embodiment, tunneling film 29 may be silicon oxide formed to a thickness of about 155 A using, for example, a high temperature oxide process.

In FIG. 6B, mask layer 30 is formed over substrate 10. Mask layer 30 may be a patterned layer of photoresist.

In FIG. 6C, Vss spacers 32a and 32b have been formed along opposing side walls of floating gates 22a and 22b and corresponding caps 26 by removing the unmasked portions of tunneling film 29 and corresponding portions of film 27 from Vss area 31 and caps 26. The mask layer 30 has also been removed. The removal of these unmasked portions of tunneling film 29 and film 27 may be accomplished using a plasma etching process. As can be seen, Vss spacers 32a and 32b are formed by remaining unmasked portions of the tunneling film 29 and the film 27.

Figure 7A:
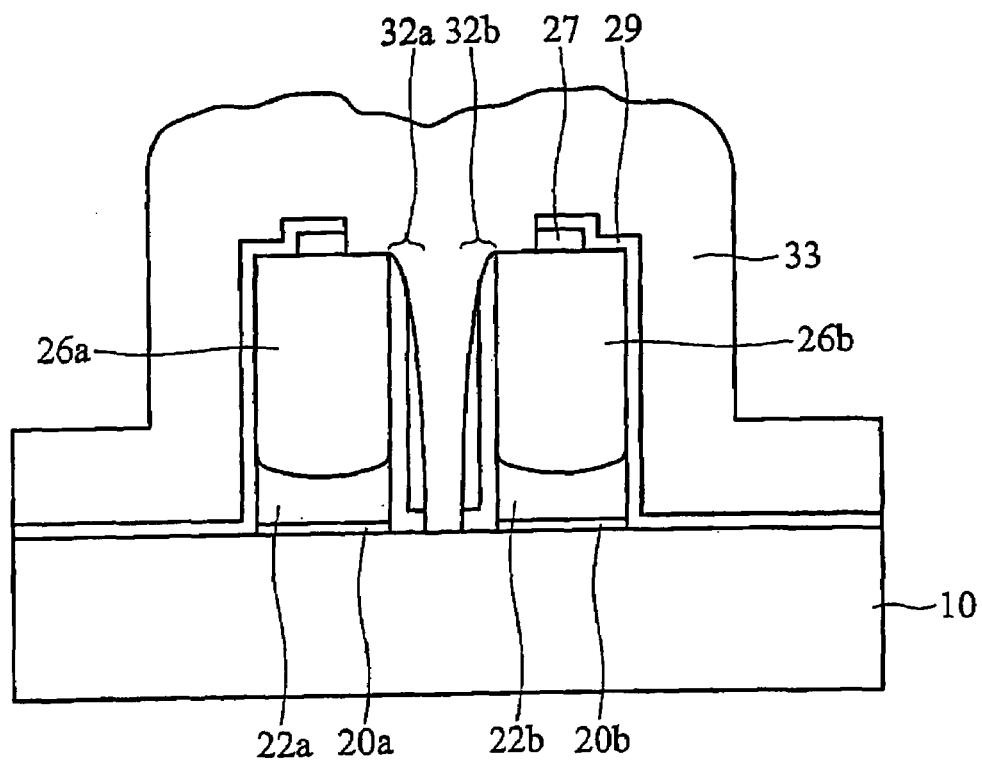
Figure 7B:
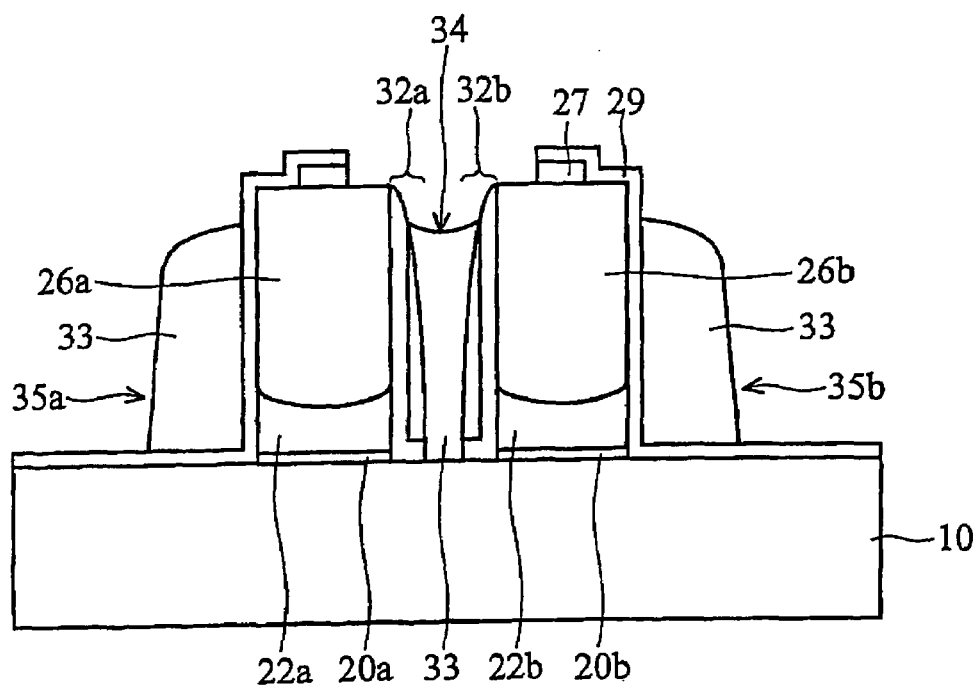
Figure 7C:
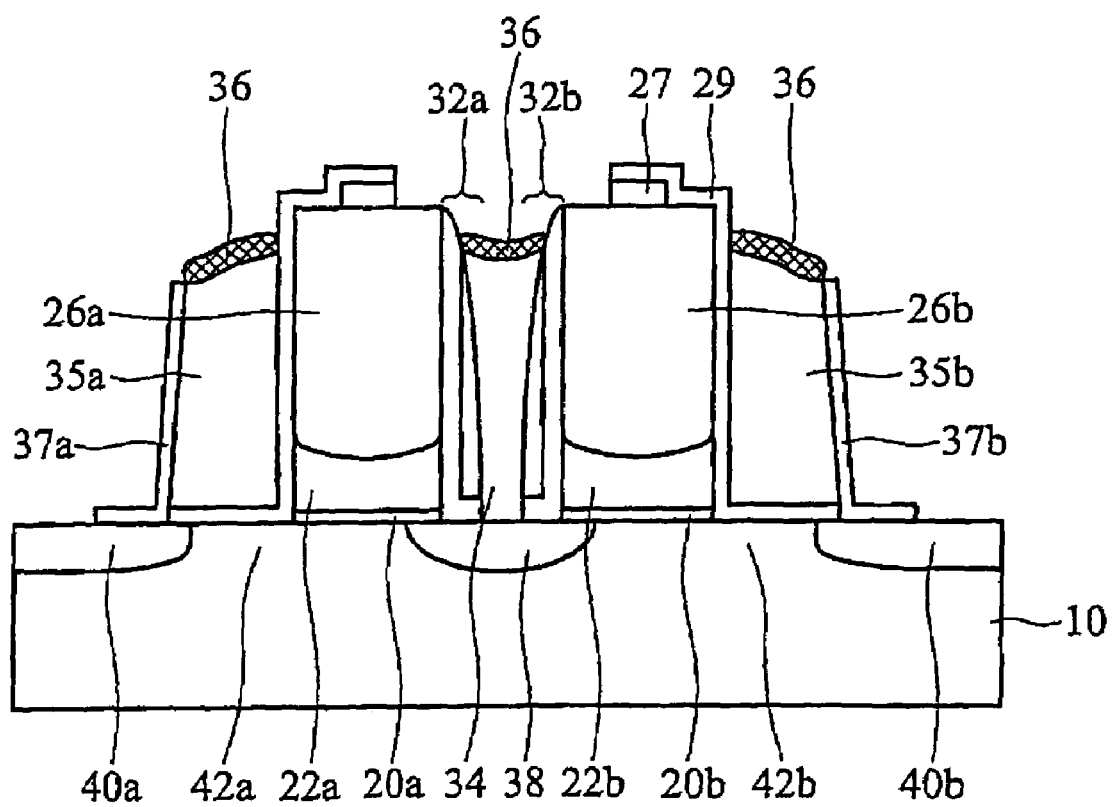

FIGS. 7A–7C illustrate an exemplary method for forming electroductive Vss plug and electroductive wordline spacers. In FIG. 7A, a conformal, electroconductive film 33 has been formed over substrate 10. In one embodiment, the electroconductive film 33 may be a film of doped polysilicon having a thickness of about 1800 A.

In FIG. 7B, the electroconductive film 33 has been partially removed to form electroconductive Vss plug 34 between Vss spacers 32a and 32b, and electroconductive wordline spacers 35 along the dielectrically coated outer side walls of floating gates 22a and 22b and caps 26. The partial removal of electroconductive film 33 can be accomplished using an etch-back process such as plasma etching.

In FIG. 7C silicide films 36 have been formed over Vss plug 34 and wordline spacers 35a and 35b and composite spacers 37a and 37b have been formed on the outer side walls of the wordline spacers 35a and 35b, to complete the memory cell. The silicide films 36 may be formed using a salicide process. In one embodiment, the silicide films 36 may comprise cobalt silicide films.

The composite spacers 37a and 37b may be formed by depositing a conformal SiN film over substrate 10. The SiN film may have a thickness of about 300 A and be formed using LPCVD. Next, a tetraethyl orthosilicate (TEOS) film is formed over the SiN film. The TEOS film may have a thickness of about 1000 A and be formed using LPCVD. The TEOS and SiN films are separately etched to form spacers 37a and 37b. Each etching process may be accomplished using a dry plasma etch process.

As can be seen in FIG. 7C, floating gates 22a and 22b are electrically associated with a common source region 38 formed in substrate 10 and wordline spacers 35a and 35b are electrically associated with respective drain regions 40a and 40b formed in the substrate 10. Channel regions 42a and 42b are created in substrate 10 between common source region 38 and respective drain regions 40a and 40b when appropriate electrical biases are applied thereto during cell programming. The sharp upwardly flared corner tip adjacent the Vss plug 34 of each floating gate 22a and 22b, increases the coupling area, which increases the capacitance between the floating gates 22a and 22b and common source region 38. The increased capacitance increases the programming speed of the memory cell, i.e., the writing and erasing speeds of the cell. The square or rectangular shape caps 26 provide for the square wordline spacers 35a and 35b. The square wordline spacers 35a and 35b, in turn, increase the processing window for the L shaped spacers 37a and 37b and the salicide process. The elongated Vss spacers 32a and 32b are thinner than conventional Vss spacers, thereby increasing coupling efficiency.

While the foregoing invention has been described with reference to the above, various modifications and changes can be made without departing from the spirit of the invention. Accordingly, all such modifications and changes are considered to be within the scope of the appended claims.

What is claimed is:

1. A method of making a flash memory cell comprising a floating gate with corners each having a sharp, upwardly flared shape, the method comprising the steps of:
   providing a substrate of semiconductor material;
   forming a mask film over the substrate;
   defining a trench in the mask film, the trench terminating above the substrate;
   at least partially filling the trench with a first film of electroconductive material;
   etching back a portion of the first film of electroconductive material to form the floating gate with the sharp, upwardly flared corners;
   at least partially filling the trench with a second film of the electroconductive material; and
   etching back at least a portion of the second film of the electroconductive material to further sharpen and upwardly flare the corners of the floating gate.

2. The method according to claim 1, wherein the etching back step performed after the step of at least filling the trench with the second film of the electroconductive material etches back another portion of the first film of the electroconductive material.

3. The method according to claim 2, further comprising the step of at least partially filling the trench with a dielectric material to form a protective cap over the floating gate.

4. The method according to claim 1, further comprising the step of at least partially filling the trench with a dielectric material to form a protective cap over the floating gate.

5. The method according to claim 1, further comprising the step of at least partially filling the trench with a dielectric material to fonn a protective cap over the floating gate.

6. The method according to claim 1, wherein the substrate includes at least two shallow trench electrical isolation regions and further comprising the step of removing selected additional portions of the first film of the electroconductive material covering the shallow trench electrical isolation regions to electrically isolate the cell.

7. The method according to claim 1, wherein the substrate includes at least two shallow trench electrical isolation regions and further comprising the step of removing selected additional portions of the first film of the electroconductive material covering the shallow trench electrical isolation regions to electrically isolate the cell.

8. The method according to claim 2, wherein the substrate includes at least two shallow trench electrical isolation regions and further comprising the step of removing selected additional portions of the first film of the electroconductive material covering the shallow trench electrical isolation regions to electrically isolate the cell.

9. The method according to claim 3, further comprising the step of forming a dielectric Vss spacer along a side wall defined by the floating gate and the protective cap.

10. The method according to claim 4, further comprising the step of forming a dielectric Vss spacer along a side wall defined by the floating gate and the protective cap.

11. The method according to claim 5, further comprising the step of forming a dielectric Vss spacer along a side wall defined by the floating gate and the protective cap.

12. The method according to claim 1, wherein a dielectric film is disposed between the substrate and the mask film, the trench defining step exposing a portion of the dielectric film at a bottom of the trench.

13. The method according to claim 12, further comprising the step of removing the portion of the dielectric film at the bottom of the trench before the trench filling step.

14. The method according to claim 13, further comprising the step of forming a coupling film over the exposed portion of the substrate before the trench filling step.

15. The method according to claim 1, further comprising the step of removing the mask film.

16. A method of making a flash memory cell comprising a floating gate with corners each having a sharp, upwardly flared shape, the method comprising the steps of:
   providing a substrate of semiconductor material;
   forming a mask film over the substrate, wherein a dielectric film is disposed between the substrate and the mask film;
   defining a trench in the mask film, the trench terminating above the substrate, the trench defining step exposing a portion of the dielectric film at a bottom of the trench;
   at least partially filling the trench with a first film of electroconductive material;
   etching back a portion of the first film of electroconductive material to form the floating gate with the sharp, upwardly flared corners; and
   removing the portion of the dielectric film at the bottom of the trench before the trench filling step.

* * * * *